United States Patent [19]

Collantes, Jr. et al.

[11] Patent Number: 5,195,302

[45] Date of Patent: Mar. 23, 1993

[54] PACKAGING FOR POPULATED CIRCUIT BOARDS

[75] Inventors: Patricio J. Collantes, Jr.; Marilyn S. Highland, both of San Jose; Sam Kazarian, Fremont, all of Calif.

[73] Assignee: Adaptec, Incorporated, Milpitas, Calif.

[21] Appl. No.: 779,701

[22] Filed: Oct. 21, 1991

[51] Int. Cl.5 .......................... B65B 53/02; B65B 55/00
[52] U.S. Cl. ........................................ 53/442; 53/412; 53/472; 206/328
[58] Field of Search .............. 53/442, 412, 509, 133.8, 53/557, 441, 556; 206/328

[56] References Cited

U.S. PATENT DOCUMENTS

| | | | |
|---|---|---|---|
| 3,756,399 | 9/1973 | Cosier et al. | 206/328 X |
| 3,906,702 | 9/1975 | Yano | 53/442 X |
| 4,707,414 | 11/1987 | Long et al. | 206/328 X |
| 4,823,945 | 4/1989 | Adelman | 206/328 X |
| 5,033,253 | 7/1991 | Havens et al. | 53/442 X |
| 5,072,574 | 12/1991 | Puett | 53/509 X |

OTHER PUBLICATIONS

Cryovac EPD-512 Film Description, 2 pages.
Protech Specification Sheet, 1 page.
Film Protects Circuit Boards In Three Ways, "Packaging" magazine, May 1990, Cahners Publishing Company, 1 page.

*Primary Examiner*—James F. Coan
*Attorney, Agent, or Firm*—Skjerven, Morrill, MacPherson, Franklin & Friel

[57] ABSTRACT

A package system for populated circuit boards is disclosed. The circuit board is placed on a piece of conductive paperboard and is shrink wrapped with an antistatic film, which may be provided with a tearstrip. Placed on a cardboard carton, the package provides good protection against physical shocks, vibration and electrostatic discharge.

8 Claims, 2 Drawing Sheets

PACKAGING FOR POPULATED CIRCUIT BOARDS

FIELD OF THE INVENTION

This invention relates to a method and structure of packaging populated circuit boards.

BACKGROUND OF THE INVENTION

A packaging system for "populated" printed circuit boards, i.e., circuit boards on which integrated circuit chips and other components have been installed, must meet two important criteria. First, the packaging must protect the printed circuit board (PCB) from physical shock and vibration. Second, the packaging must protect the PCB against electrostatic discharge. A voltage of less than 100 volts created by an electrostatic discharge can damage some electronic components.

At present, many populated PCB's are placed inside a loose-fitting electrostatic discharge (ESD) bag. The ESD bag and PCB are then placed inside a box or carton and cushioned with antistatic foam. The ESD bag and foam protect the PCB against electrostatic discharge, and the foam guards the PCB against shock or vibration. Alternatively, instead of using antistatic foam, cardboard can be folded inside the box so as to form a protective enclosure around the ESD bag and PCB.

These methods have several disadvantages. Most ESD bags are dark-tinted and difficult to see through. This makes inspecting the PCB difficult unless it is removed from the bag. The antistatic foam is non-biodegradable and therefore creates a disposal problem. Moreover, the box or carton must be made somewhat larger to accommodate the foam.

SUMMARY OF THE INVENTION

In a packaging arrangement according to this invention, a populated PCB rests on a conductive base which has dimensions larger than those of the PCB. The PCB and conductive base are surrounded with an antistatic film which has been shrunk by the application of heat and thereby holds the PCB firmly against the conductive base. The antistatic film is highly transparent and permits easy viewing of the circuit board and its components.

In a preferred embodiment, the base is a piece of conductive paperboard or cardboard. A tear strip may be applied to the antistatic film to allow easy opening of the package.

The package may be placed in a cardboard carton for shipment. The antistatic film and conductive base in effect surround the PCB and its components with a shield against electrostatic discharge. The perimeter of the base surrounding the PCB protects it against shocks and vibrations.

A process for preparing such a package is also described.

DESCRIPTION OF THE INVENTION

Figure 1:
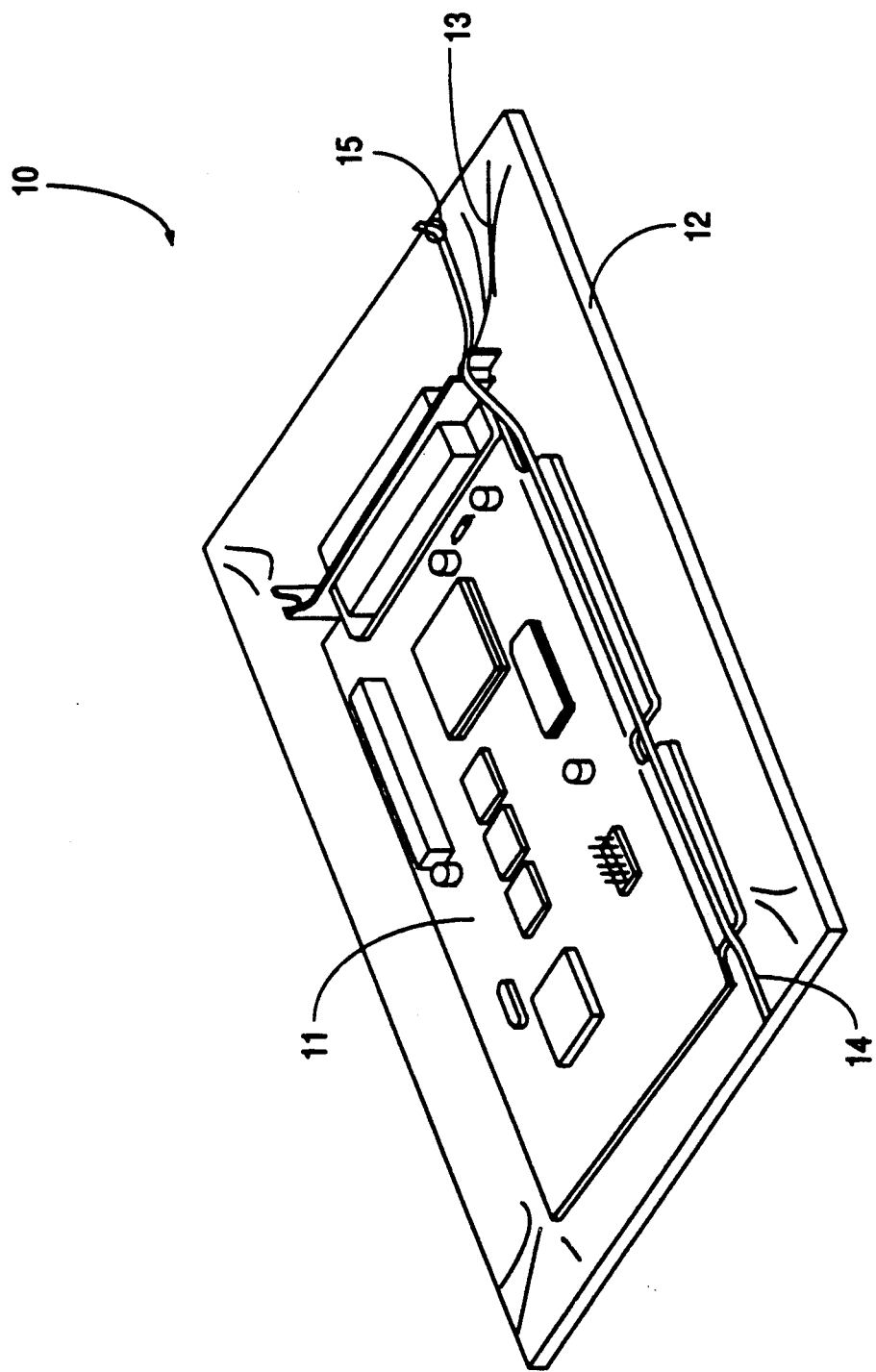
FIG. 1 illustrates a package for a fully populated PCB in accordance with this invention.

As shown in FIG. 1, a package 10 includes a populated PCB 11 which is placed on a base 12 of conductive cardboard. The dimensions of base 12 are larger than those of PCB 11, so that base 12 extends beyond the perimeter of PCB 11. Base 12 may be paperboard impregnated with a conductive carbon-polymer system known as Protech TM which is available from Jefferson Smurfit Corporation or its subsidiary, Container Corporation of America.

PCB 11 and base 12 are surrounded by an antistatic film 13. Antistatic film 13 is a transparent film which shrinks with the application of heat. Antistatic film 13 is applied to PCB 11 and base 12 using equipment which is well known in the industry (such as the Pack-All Model 13X19UC L-Sealer), wherein it is heated and shrunk so as to press PCB 11 firmly against base 12. Antistatic film 13 may be the EPD-512 Film available from the Cryovac Division of W. R. Grace & Co., Duncan, S.C. 29334.

To permit easy opening of the package, a tearstrip 14 is applied to transparent film 13. Tearstrip 14 is applied to the inside of antistatic film 13 and one end of tearstrip 14 protrudes through a hole 15 in antistatic film 13. Tearstrip 14 may be a product known as Shrinktape TM which is available from Tearstrip Systems, Inc., of Conshohocken, Pa. 19428.

Figure 2:
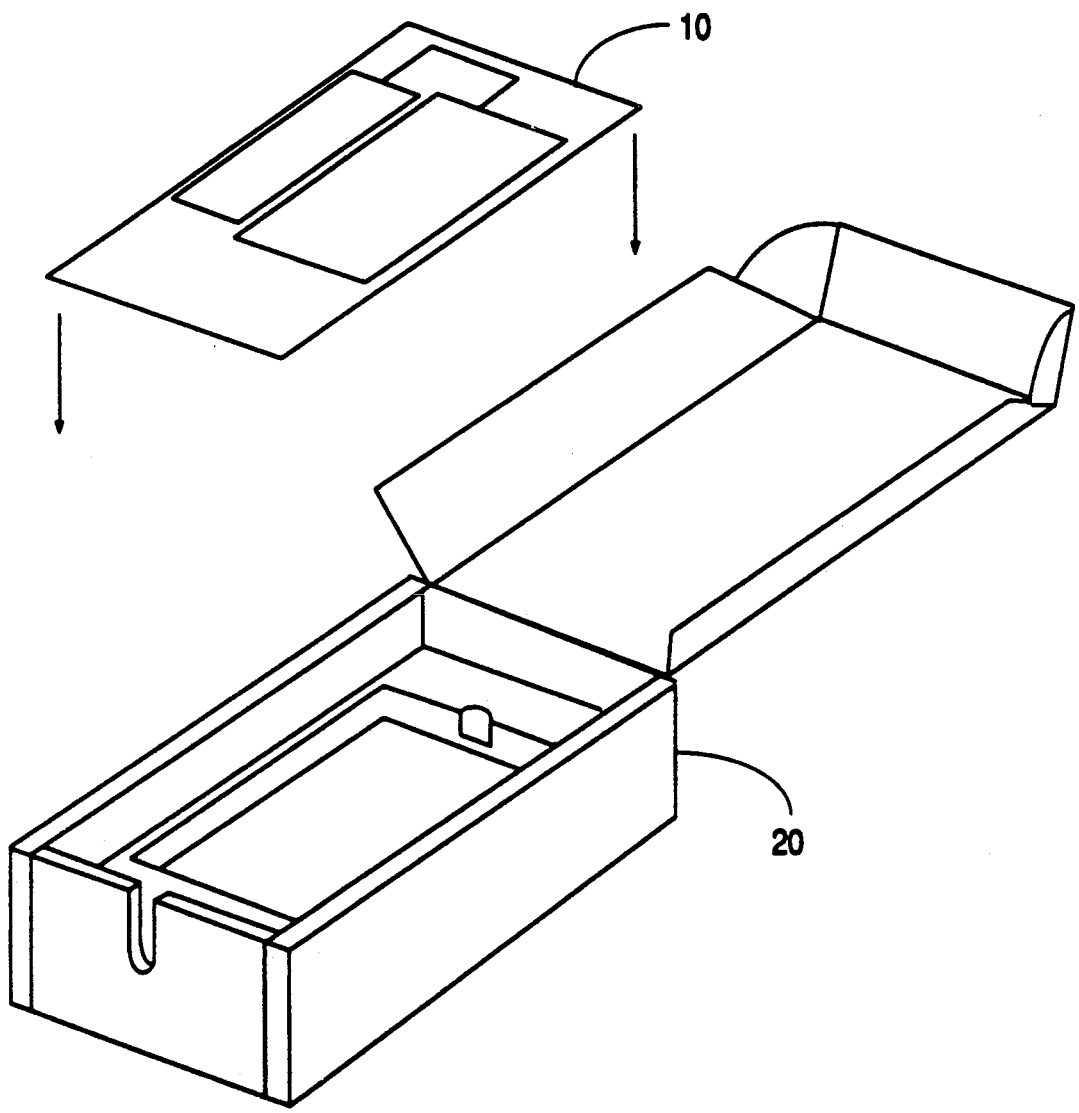
FIG. 2 illustrates the placement of the package in a carton for shipment.

Package 10 may be placed in a carton 20 as shown in FIG. 2. The dimensions of base 12 are just slightly less than the dimensions of carton 20 so that package 10 can be easily packed into and removed from carton 20 while being held snugly in place when carton 20 is closed.

The packaging system of this invention is simple, relatively inexpensive, and provides a populated PCB with excellent protection against electrostatic discharge as well as physical shocks and vibration. It also permits easy inspection of the PCB.

The results of test performed on a package according to this invention are set forth in the appendix.

The description of an embodiment of this invention is intended to be illustrative and not limiting. Numerous other embodiments will be apparent to those skilled in the art, all of which are included within the broad scope of this invention.

APPENDIX

The packaging of populated printed circuit boards using antistatic shrink wrap (EPD-512 from Cryovac) with a tear away strip (ShrinkTape), and a conductive corrugated paperboard tray was tested to evaluate the system's effectiveness. A total of five samples were used for the test. Each sample contained a populated printed circuit board (Adaptec AHA-1510), antistatic shrink wrap with tear-away strip, a conductive corrugated tray, two software packages, a spare bracket and the outer box which contained all the above items.

I. SCOPE OF TESTING

Testing of the packaged samples involved four steps. The first two tests involved using a random vibration table. The first of these vibration tests simulated shocks which would be encountered by the packages if they were shipped using a truck or via land. The second vibration test simulated shocks the packages would encounter if shipped by plane or via air. The third test involved dropping the packages from a given height to a flat surface. The fourth test involved subjecting the packages to a static discharge ranging from 4,000 to 20,000 volts.

II. PRELIMINARY PREPARATIONS

The boards used as test samples were tested to confirm their functionality. All the boards passed a functional test. The boards were then packaged in the conductive tray and shrink wrapped with the antistatic film and tearaway strip. The completed shrink wrapped package was then placed in the outer box in which the two software packages and the spare bracket had already been placed. The outer box was then closed and numbered to identify each test sample.

III. VIBRATION TESTING

Prior to placing the five samples on the vibration table, each sample was opened and inspected for any initial damage such as tears or holes in the antistatic shrink film. Results of this initial inspection were as follows:

1. With the exception of a ⅛-inch air escape hole created in the shrink wrap process, there were no tears or other holes present in the five samples.
2. All five outer boxes were intact and had no tears or damage on their surfaces.

The five samples were strapped onto the vibration table with the bottom of the outer box against the table's surface. The first vibration test ran for 30 minutes and simulated shocks or vibration encountered on a truck bed. At the end of the 30-minute test period, the five samples were removed from the vibration table and opened for inspection. Results were as follows:

1. There were no tears or other holes other than the air escape hole.
2. There was no damage to the outer box.
3. The other components of the package such as the spare bracket and the software package were all intact and remained in place.

The samples were then placed on the vibration table with the same orientation for the second vibration test. The second test simulated shocks encountered by shipping the packages via an aircraft. The second vibration test lasted 30 minutes. At the end of the 30-minute period, the samples were removed and opened for inspection. Results were as follows:

1. There were no tears or new holes in the shrink wrap as a result of the test.
2. There was no enlarging of the air escape hole into a larger hole or a tear.
3. All the other components, the spare bracket and the software packages remained in place.

IV. DROP TESTING

Drop testing involves raising the packages to a predetermined height and then dropping them onto a flat, hard surface. The drops were repeated a total of ten times, wherein the box was dropped on all six of its flat panels and on four corners. The height of the drops was determined as follows:

| PACKAGE WEIGHT | HEIGHT |
| --- | --- |
| 0-15 lbs | 36 inches |
| 15.1-40 lbs | 30 inches |
| 40.1-60 lbs | 24 inches |
| 60.1-80 lbs | 18 inches |

The five packages averaged 2.5 lbs in weight, requiring a drop height of 36 inches from a hard surface. For uniformity of drips, a drop test mechanism was used. The machine contained a variable height platform which swings away from below the package thereby allowing repeatability of drops from one box to the other.

Prior to the start of drop testing, each package was opened and inspected for any damage. The packages were not damaged in any way prior to the drop testing. The samples were dropped in sequence as they were numbered, and each box was opened after completion of the set of drops required. Results of the drop test for each box was as follows:

1. Box number 1
   a. No damage to the end panels of the outer box.
   b. Crushing on corners of box which sustained the corner drops.
   c. No holes or tears on the shrink wrap with exception of air escape hole.
   d. Slight movement of printed circuit board inside shrink wrap (approximately ⅛ inch)
   e. Shrink wrap shows slight stretching (approximately ⅛ inch). This is due to movement mentioned above.
   f. Shrink wrap is still wrapped very tightly around the printed circuit board and conductive tray.
2. Box number 2
   a. No damage to the end panels of the outer box.
   b. Crushing on corners of box which sustained the corner drops.
   c. No holes or tears on the shrink wrap with exception of air escape hole.
   d. Slight crushing on one corner of the conductive corrugated. Shrink wrap also crushed or folded but did not tear.
   e. Slight movement (approximately ⅛ inch) of the printed circuit board inside shrink wrap.
   f. Shrink wrap shows slight stretching due to movement of printed circuit board.
   g. Shrink wrap is still wrapped very tightly around printed circuit board and conductive tray.
3. Box number 3
   a. No damage to the end panels of the outer box.
   b. Crushing on corners of box which sustained the corner drops.
   c. Shrink wrap is still wrapped very tightly around the printed circuit board and the conductive tray.
   d. No new tears or holes on the shrink wrap with the exception of the air escape hole.
4. Box number 4
   a. No damage to the end panels of the outer box.
   b. Crushing on corners of box which sustained the corner drops.
   d. No new holes or tears on the shrink wrap with the exception of the air escape hole. Air escape hole enlarged a bit (by approximately 1/16-⅛ inch) due to hole coinciding in location with a corner of bracket on the printed circuit boards.
   e. Slight movement (approximately ⅛ inch) of the printed circuit board.
   f. Shrink wrap still wrapped very tightly around printed circuit board and conductive tray.
5. Box number 5
   a. No damage to end panels of the outer box.
   b. Crushing on corners of box which sustained the corner drops.
   c. No new holes or tears on the shrink film with the exception of the air escape hole.
   d. Shrink wrap is still wrapped very tightly around the printed circuit board and the conductive tray.

V. FUNCTIONAL RE-TESTING

All five of the packages were then disassembled. The printed circuit boards were removed from the shrink wrap and conductive tray. The removal process was facilitated using the built-in tearaway strip. The printed circuit boards were then subjected to another functional test to ensure that the vibration and drop testing did not damage them functionally. All of the printed circuit boards passed the functional test.

VI. STATIC DISCHARGE TEST

To evaluate the electrical properties of the antistatic film (EPD-512 from Cryovac), the following test was performed. This test involved using a static charge generator, which can store a static charge and discharge it onto a product being tested. The static charge generator has a probe which is used to arc the discharge onto the test product. In order for the static charge to arc from the probe to the product being tested, the probe must come near a metal portion of the product. The antistatic shrink wrap film must prevent damage to the product by not allowing an arc to generate between the static charge generator's probe and the printed circuit board.

Prior to performing the test, the same boards used in the vibration and drop tests were again placed in the conductive corrugated paperboard with tear strip and shrink wrapped using the antistatic film. The boards were known to be functional because they had just been retested after the vibration and drop tests.

The static charges generated and used for this test were 4,000, 8,000, 12,000, 16,000, and 20,000 volts. Each printed circuit board assembly was subjected to a specific voltage: the first board to 4,000 volts, the second board to 8,000 volts, the third board to 12,000, volts and so on. It was noted that the static charge board would not arc between the generator's probe and the antistatic shrink wrap. After each board had been subjected to the static charge generator, it was removed from its packaging and functionally retested. All the boards passed the test. This proves the effectiveness of the antistatic shrink film as a shield against static discharge.

VII. CONCLUSION

The testing done to this packaging system proved its effectiveness. The system not only provides shock protection but also protection against static discharge. The tearaway strip provides an easy means to open this package. This prevents the possible damage to the printed circuit board that might occur if the end user were to use a sharp instrument to open the shrink wrap film.

We claim:

1. A package for a populated printed circuit board comprising:
    a conductive base having dimensions larger than the dimensions of said printed circuit board, said printed circuit board being positioned on said conductive base; and
    a sheet of antistatic film capable of being shrunk by the application of heat, said sheet of film surrounding said printed circuit board and said conductive base and being shrunk so as to hold said printed circuit board against said conductive base, thereby preventing relative motion between said printed circuit board and said conductive base.

2. The package of claim 1 wherein a tear strip is applied to said antistatic film.

3. The package of claim 1 wherein said conductive base comprises conductive cardboard or paperboard.

4. The package of claim 1 wherein said antistatic film is transparent.

5. A method of packaging a populated printed circuit board, comprising the steps of:
    positioning said printed circuit board on a conductive base, the dimensions of said base being larger than the dimensions of said printed circuit board;
    surrounding said printed circuit board and said conductive base with a sheet of antistatic film, said film capable of being shrunk by the application of heat; and
    applying sufficient heat to said antistatic film to shrink said film and thereby press said printed circuit board against said conductive base, thereby preventing relative motion between said printed circuit board and said conductive base.

6. The method of claim 5 comprising the additional step of applying a tear strip to said antistatic film.

7. The method of claim 5 wherein said antistatic film is transparent.

8. The method of claim 5 wherein said conductive base comprises conductive cardboard or paperboard.

* * * * *

UNITED STATES PATENT AND TRADEMARK OFFICE
CERTIFICATE OF CORRECTION

PATENT NO.   : 5,195,302
DATED        : March 23, 1993
INVENTOR(S)  : Collantes, et al.

It is certified that error appears in the above-identified patent and that said Letters Patent is hereby corrected as shown below:

Col. 3, line 67, delete "drips" and substitute -- drops --.

Signed and Sealed this

First Day of February, 1994

Attest:

BRUCE LEHMAN

*Attesting Officer*          Commissioner of Patents and Trademarks